United States Patent [19]

Iantorno

[11] 4,147,397

[45] Apr. 3, 1979

[54] ELECTRICAL ASSEMBLY IN COMBINATION WITH PRINTED CIRCUIT BOARD

[75] Inventor: James Iantorno, Mamaroneck, N.Y.

[73] Assignee: Sealectro Corporation, Mamaroneck, N.Y.

[21] Appl. No.: 887,603

[22] Filed: Mar. 17, 1978

Related U.S. Application Data

[62] Division of Ser. No. 782,041, Mar. 28, 1972, abandoned.

[51] Int. Cl.² .................. H01R 11/08; H05K 1/08
[52] U.S. Cl. .................. 339/17 C; 339/17 M; 339/95 R; 339/220 R
[58] Field of Search .............. 339/17 R, 17 C, 17 M, 339/17 B, 95 R, 95 A, 220 R, 220 T; 174/87

[56] References Cited

U.S. PATENT DOCUMENTS

| | | | |
|---|---|---|---|
| 2,902,629 | 9/1959 | Little et al. | 339/17 C |
| 3,022,369 | 2/1962 | Rayburn | 339/220 R |
| 3,875,324 | 4/1975 | Waddington et al. | 174/87 |

*Primary Examiner*—Neil Abrams
*Attorney, Agent, or Firm*—Anthony J. Casella

[57] ABSTRACT

An electrical connector for maintaining electrical contact in electronic circuitry comprises a wire formed helix, the wire being substantially square in cross-section. One end of the helix is open for receiving wire leads. The helix tapers from the open end to the opposite end thereof. The edges of the square wire provide the helix with an internal and external thread. In one alternate embodiment the connector includes an integral probe member which extends from the tapered end of the helix. In another embodiment the connector is a continuous helix having two receiving ends, the helix tapering from each receiving end to an intermediate point therebetween. In a further embodiment the connector comprises two oppositely wound helixes each having an open receiving end. Each helix tapers from its receiving end to a tapered end. The connector further includes an extension member which is disposed between the helixes and is integral with the tapered end of each helix.

6 Claims, 5 Drawing Figures

ELECTRICAL ASSEMBLY IN COMBINATION WITH PRINTED CIRCUIT BOARD

This is a division of Application Ser. No. 782,041 filed Mar. 28, 1972 now abandoned.

BACKGROUND OF THE SUBJECT INVENTION

The subject invention relates to connectors used in electronic circuitry. More particularly, the subject invention relates to coupling or contact devices that may be used as adapters, probes, terminals, spacers between printed circuit boards and the like. Generally, known devices receive wire ends and/or component leads, for maintaining electrical contact in electronic circuits, and are attached thereto by various methods such as crimping, wrapping, or soldering. A typical example of the use of such devices is in breadboard circuitry in which connections are sometimes made by inserting wire ends and component leads into isolated or bussed strip contacts. Because of variations in diameter and strength of different wires and leads, it is often necessary to attach adapters having the desired size to the ends of the wires or leads.

Heretofore known devices are generally machined parts adapted to be attached to the ends of wires or leads. In addition to crimping, wrapping, or soldering, other methods of attaching the coupling devices include female spring contacts, tapered hole receptacles, and spring loaded ball devices. Other attachment means such as providing the device with an internal thread have been impractical because of the very small size of the devices, and the difficulty in machining a thread therein. In practice, known devices employing the above attachment means, have several shortcomings. For one thing, all the known devices are relatively expensive to manufacture because of the machining costs. Although attempts have been made to stamp components, die costs are high. Moreover, performance of the devices is often limited, and required changes in tooling is expensive. Some known devices are difficult to use, or, as with the devices which are attached by crimping, wrapping, or soldering, require the use of tools to make the proper connection. Other devices will not accept a range of wire sizes or do not hold securely.

Accordingly, it is an object of the subject invention to provide a coupling or contact device for electronic circuitry which is simple in construction and inexpensive to manufacture.

It is another object of the subject invention to provide a coupling or contact device for electronic circuitry having the above characteristics which is adapted to receive a range of wire sizes.

It is a further object of the subject invention to provide a coupling or contact device for electronic circuitry having the above characteristics without the use of tools.

It is a further object of the subject invention to provide a coupling or contact device for electronic circuitry having the above characteristics which may be easily uncoupled.

SUMMARY OF THE INVENTION

In accordance with the subject invention, a coupling device for maintaining electrical contact in electronic circuitry comprises a tightly wound wire formed helix, the wire being substantially square in configuration. One end of the helix is for receiving a wire end or component lead. The helix tapers from said receiving end to the other end thereof, thus defining successive coils which progressively decrease in diameter from the receiving end of the helix to the other end thereof. Because the wire from which the helix is formed is substantially square in configuration, the resulting helix is provided with an internal thread for securely engaging a wire end or component lead within the helix. In addition, the helix is also provided with an external thread for fastening the helix, for example, to a printed circuit board conductor.

In operation, a wire end or component lead is inserted into the receiving end of the helix until circumferential contact is made with one of the coils of the helix. Slight additional pressure causes the contacted coil to deflect outwardly causing partial engagement of the wire end or lead. Rotation of the lead causes the internal threads of the helix to form a thread into the lead thus effecting full and secure engagement thereof.

In an alternate embodiment of the subject invention the coupling device includes an integral probe member at the tapered end of the helix, which extends substantially parallel to the longitudinal axis of the helix.

In another alternate embodiment of the subject invention, the connector is a unitary, continuously wound helix. Each end of the helix is open for receiving a wire lead. The helix tapers from each of the open ends to an intermediate point therebetween. The connector has an internal thread and an external thread.

In a further alternate embodiment, the coupling device of the subject invention includes first and second tapered helixes which have been wound in opposite directions, the helixes being integrally connected by an intermediate extension member. The helixes each taper towards the intermediate extension member so that the composite coupling device has a receiving end at each extreme of the device. The connector is provided with internal and external threads.

DESCRIPTION OF THE PREFERRED EMBODIMENTS

Figure 1:
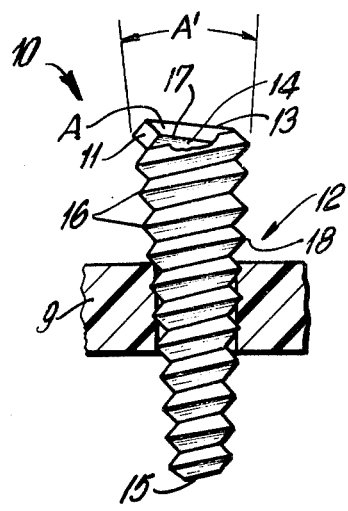
FIG. 1 is an elevational view of a connector of the subject invention.

Referring to FIG. 1, a coupling or connecting device 10 for maintaining electrical contact in electronic circuitry is illustrated. Typically, the connector 10 may be used as an adapter or general purpose holder. As illustrated in FIG. 1, the connector 10 is secured in a printed circuit board 9.

In accordance with the subject invention, the connector 10 is formed from a wire 11 which has a substantially square cross-section. The wire may be any conductive material such as, for example, phosphorus bronze or heat treated beryllium copper. Preferably, wire 11 is made from 0.25 inch square wire wrap stock having a maximum corner radius of 0.003 inches.

As illustrated in FIG. 1, wire 11 is wound in a counter-clockwise direction to provide a helix 12 having a lead-in angle A. Wire 11 is typically wound on any conventional wire forming machinery. One end of helix 12, namely receiving end 13, is provided with a receiving aperture 14 for receiving a wire end or component lead. The helix 12 tapers from receiving end 13 to a tapered end 15 to form successive coils 16 which progressively decrease in diameter along angle A', which may typically be on the order of 10°. The spacing between coils 16 is preferably in a range of approximately 0.000–0.003 inches. Typically, the coil 16 which defines the receiving end 13 may have a diameter on the order of 0.065 inches.

Still referring to FIG. 1, it can be appreciated that because wire 2 has a substantially square cross-section, the wire has relatively sharp corner edges, which, when the wire is wound in accordance with the subject invention, provides connector 10 with an internal thread 17 for engaging and securing a lead within helix 12, and an external thread 18 for fastening connector 10, for example, to printed circuit board 9. Of course, the external thread 18 is also useful as a gripping means for preventing slippage of the connector when inserting a lead, or fastening the connector to a conductor.

In practice, a wire end or component lead is inserted into receiving aperture 14 of connector 10 until circumferential contact is made with one of the coils 16 of helix 12. Slight additional pressure causes the contacted coil 16 to deflect outwardly, effecting a partial engagement of the wire end or lead. Rotation of the lead in a direction opposite to the wind of helix 12, i.e., in a clockwise direction for the connector of FIG. 1, tends to increase the diameter of the contacted coils 16 because of the drag which is created when the sharp internal threads 17 cut into the surface of the lead. As the diameter of coils 16 increases further penetration of the lead into connector 10 is effected. As the free end of the lead is released, the force on the engaged end of the lead increases as the coils 16 attempt to rotate in a counter-clockwise direction to return to their original tightly wound state. As a result, the lead is very securely engaged within the connector 10. Because of the intimate contact between the lead and connector 10 there is low electrical resistance and improved performance. In order to remove the lead from the connector, the lead is simply rotated in a counter-clockwise direction. Upon removal it will be noticed that the lead has a thread formed therein resulting from the contact with the connector's internal thread.

The tapered end 15 of connector 10 may be inserted into a printed circuit board contact, and the connector fastened thereto by clockwise rotation of the connector.

It will be appreciated that because of the construction of connector 10 it is capable of receiving and engaging a range of different size wire ends or leads, the range being of wires having a diameter smaller than the coil 16 at the receiving end 13 of helix 12 and greater than the coil 16 at the tapered end 15 of helix 12. In addition, the connector 10 may be fastened to a range of different size openings.

It should be noted that as well as serving as an adapter or general holding device, the connector 10 of FIG. 1 may be used as a tube connector or a printed circuit board spacer.

Figure 2:
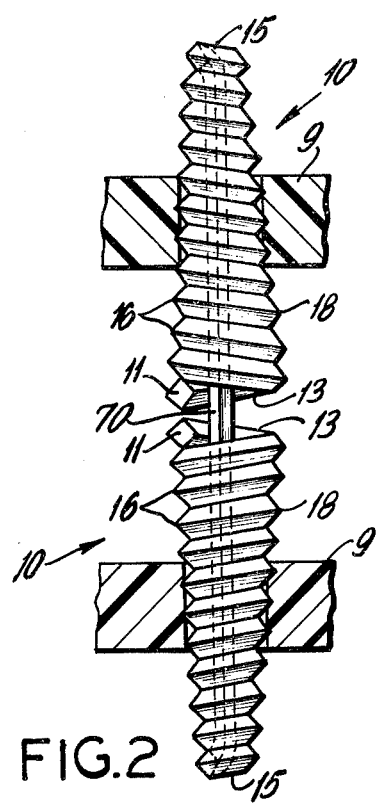
FIG. 2 is an elevational view of a combination of two connectors of FIG. 1 which may be used as a printed circuit board spacer.

For example, referring to FIG. 2, two connectors 10 are disposed in coaxial alignment with the receiving ends 13, 13 of each, facing each other. Means for connecting and appropriately spacing said connectors are also included. Typically, said means may be a rod 70 engaged and secured within both connectors. Of course, the length of rod 70 dictates the spacing between connectors 10, 10. In practice, each of the tapered ends 15, 15 of the connectors is secured in the conductor opening of a printed circuit board 9, said boards being spaced as in FIG. 2.

Figure 3:
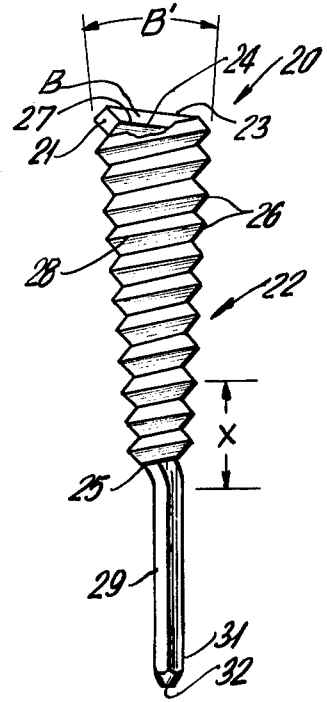
FIG. 3 is an elevational view of an alternate embodiment of a connector of the subject invention.

Referring to FIG. 3, there is illustrated an alternate embodiment of the subject invention. More particularly, there is illustrated a coupling or connecting device 20 that may be typically used as a probe for testing electronic circuit elements.

In accordance with the subject invention, connector 20 is formed from a wire 21 which has a substantially square cross-section. As in the first embodiment of the subject invention hereinabove described, the wire 21 may be any resilient conductive material such as for example, phosphorous bronze or heat treated beryllium copper. Preferably, wire 21 is made from 0.025 inch square wire wrap stock having a maximum corner radius of 0.003 inches.

As illustrated in FIG. 3, wire 21 is wound in a counter-clockwise direction forming a helix 22 having a lead-in angle B. The wire 21 may be wound on any conventional wire forming machinery. One end of helix 22, namely receiving end 23, is provided with a receiving aperture 24, for receiving wire ends or component leads. Helix 22 tapers from receiving end 23 toward a tapered end 25 to form successive coils 26 which progressively decrease in diameter along taper angle B' which may be, for example approximately 10°. The spacing between coils 26 is preferably in a range of approximately 0.000–0.003 inches. Typically, the coil 26 which defines the receiving end 23 has a diameter on the order of approximately 0.065 inches.

As with the first embodiment of the subject invention hereinabove described, wire 21, because of its corner edges, provides connector 20 with an internal thread 27 and an external thread 28.

Further referring to FIG. 3, connector 20 includes a contact member 29 which is integral with and extends from tapered end 25 of helix 22. The length and form of transitional portion X from wound helix 22 to probe member 29 is optional according to the desired use. Preferably, probe member 29 extends substantially parallel to the longitudinal axis of helix 22. However, said member 29 may also be formed with any desired configuration such as a hook, loop, right angle, etc. In addition, it is preferable that tip 31 of probe member 29 be tapered so as to terminate in a substantially flat circular base portion 32 having a diameter on the order of 0.010 inches. A wire end or lead may be inserted in receiving aperture 24 and secured engagement of said wire end or lead in connector 20 is effected in the manner described above with respect to the first embodiment of the subject invention. In addition, it should be noted that as with the previously described embodiment, connector 20, because of its particular construction, is capable of receiving and engaging a range of different size wire ends or leads, i.e., a range of diameters smaller than coil 26 at the receiving end 23 of helix 22, and greater than coil 26 at the tapered end 25 of helix 22.

Figure 4:
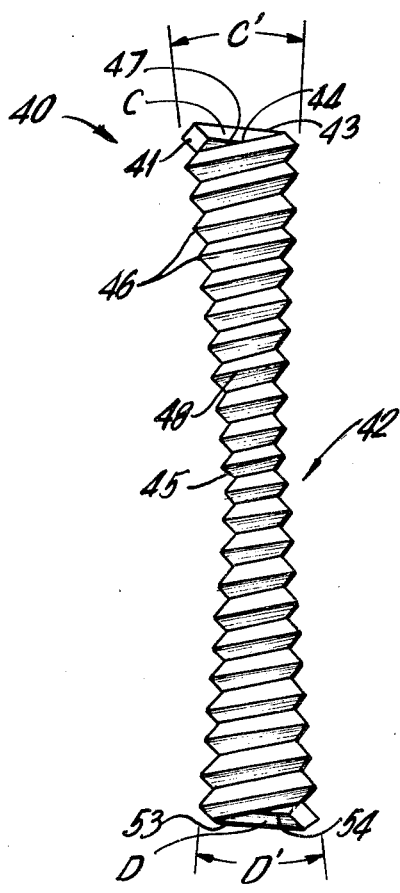
FIG. 4 is an elevational view of another alternate embodiment of a connector of the subject invention.

Referring to FIG. 4, there is illustrated another alternate embodiment of the subject invention. More particularly, FIG. 4 illustrates a coupling or connecting device 40 which may receive and engage two wire ends or leads.

In accordance with the subject invention, connector 40 is formed from wire 41 which has a substantially square cross-section. As in the previously described embodiments, wire 41 may be any resilient conductive material such as phosphorous bronze or heat treated beryllium copper. Preferably, wire 41 is made from 0.025 inch square wire wrap stock having a maximum corner radius of 0.003 inches.

As illustrated in FIG. 4, connector 40 is a wire formed helix 42 having a first receiving end 43 with aperture 44 and lead in angle C, and a second receiving end 53 with aperture 54 and lead in angle D. Typically, wire 41 is wound on any conventional wire forming machinery.

Further referring to FIG. 4, helix 42 tapers from each receiving end 43, 53 respectively, along taper angles C' and D', which may typically be on the order of approximately 10°, to a point 45 intermediate said ends, thus forming successive coils 46 which progressively decrease in diameter from the respective receiving ends to intermediate point 45. Preferably, the spacing between coils 46 is in a range of approximately 0.000-0.003 inches. Typically, each of the coils 46 which define the respective receiving ends 43 and 53 have a diameter on the order of 0.065 inches.

As with the previously described embodiments of the subject invention, the sharp corner edges of wire 41, provide connector 40 with an internal thread 47 and an external thread 48. A wire end or component lead may be inserted in receiving apertures 44 and 54, and secure engagement of said wire ends or leads is effected in the manner described with respect to to the previously described embodiments of the subject invention. It should be noted that because of its particular construction, connector 40 is capable of receiving and engaging a range of different size wire leads.

Figure 5:
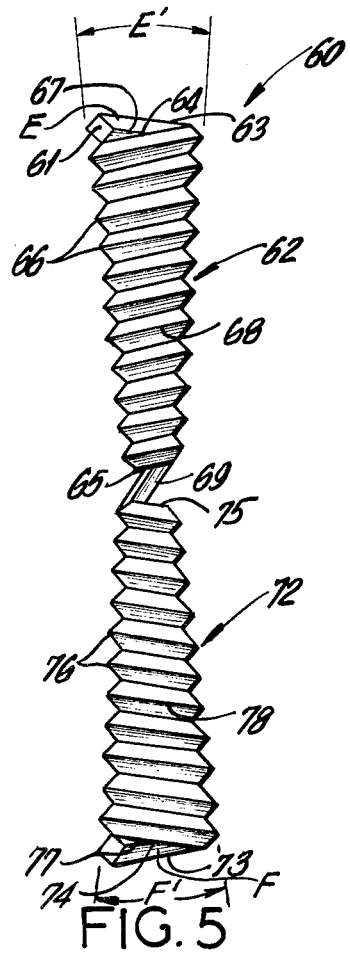
FIG. 5 is an elevational view of a further alternate embodiment of a connector of the subject invention.

Referring to FIG. 5, there is illustrated a further alternate embodiment of the subject invention. More particularly, FIG. 5 illustrates a coupling or connecting device 60 which may receive and engage two wire ends or leads, where neither of said wire ends or leads are rotatable.

In accordance with the subject invention, connector 60 is formed from wire 61 which has a substantially square cross-section. As in the previously described embodiments, wire 61 may be any resilient conductive material such as phosphorous bronze or heat treated beryllium copper. Preferably wire 61 is made from 0.025 inch square wire wrap stock having a maximum corner radius of 0.003 inches.

As illustrated in FIG. 5, connector 60 includes two integral wire formed helixes 62 and 72 which have been tightly wound in opposite directions. Specifically, helix 62 is formed by winding wire 61 in a counter-clockwise direction; helix 72 is formed by winding wire 61 in a clockwise direction. Typically, wire 61 is wound on any conventional wire forming machinery. Helix 62 has a receiving end 63 with receiving aperture 64 and a lead in angle E. Helix 72 has a receiving end 73 with receiving aperture 74 and a lead in angle F. In addition, helix 62 tapers from receiving end 63 to a tapered end 65 along taper angle E'. Helix 72 tapers from receiving end 73 to a tapered end 75 along taper angle F'. Taper angles E' and F' are each typically on the order of 10°. As a result, each helix 62 and 72 defines successive coils 66 and 76 respectively, which progressively decrease in diameter from the receiving ends 63, 73 to the tapered ends 65, 75 of each helix. Preferably, the spacing between coils 66, 76 is in a range of approximately 0.000-0.003 inches. Typically, the coils 66 and 76 which define the respective receiving ends 63 and 73 have a diameter on the order of approximately 0.065 inches.

Still referring to FIG. 5, connector 60 further includes an extension member 69 which is disposed intermediate helixes 62 and 72, and is integral with the tapered ends of said helixes, 65 and 75 respectively.

By including extension member 69, it is possible for connector 60, to be a unitary member made from a single strand of wire, and yet have two helixes, 62 and 72, which are wound in opposite directions. The function of the opposite winding of helixes 62 and 72 will become apparant later.

As with the previously described embodiments of the subject invention, the sharp corner edges of wire 61 provide helixes 62 and 72 of connector 60 with internal threads 67 and 77 and external threads 68 and 78. Accordingly, connector 60 is capable of securely engaging two wire ends or component leads. Moreover, connector 60 has the additional advantage of being able to secure said wire ends or leads even though they may not be rotatable. More particularly, in the above descriptions of the embodiments of the subject invention it was indicated that full engagement of a wire end or lead in the subject connector may be effected by rotation of the wire end or lead as said wire end or lead makes circumferential contact with a coil of the connector helix. Obviously, where the wire lead is not rotatable, the full engagement may also be effected if the wire end or lead is held steady within the connector helix, with the necessary circumferential contact, and the connector is rotated in the appropriate direction. It is also obvious that if a connector of the subject invention is to engage two wire ends or leads, neither of which is rotatable, the internal threads within the respective receiving helixes must be wound in opposite directions. For example, if two non-rotatable leads were to be engaged in the connector illustrated in FIG. 4, said connector being wound entirely in the same direction, rotation of the connector 40 in one direction would engage one lead and simultaneously tend to disengage the other lead. However, where the connector of the subject invention has oppositely wound helixes, as illustrated in connector 60 of FIG. 5, the leads inserted in the respective receiving ends 63 and 73 will either both engage or both disengage depending upon the rotation of the connector 60.

Of course, as with all of the previously described embodiments of the subject invention connector 60 is capable receiving and securely engaging a range of different wire sizes.

In summary, the subject invention provides new and improved connecting or contact devices for maintaining electrical contact in electronic circuitry. The devices of the subject invention may typically be used as adapters, probes, connectors, terminals, spacers between printed circuit boards and the like. The subject connectors are made from standard square wire wrap stock and formed on standard wire forming machinery. As a result, costs relating to raw materials, tooling, and overall manufacturing of the subject invention are substantially lower than that for heretofore known devices. In addition, minor revisions or complete changes in the structure of the subject devices may be effected quite economically. Moreover, the constructions of the subject devices provides intimate contact and secure engagement between the devices and wire ends or component leads, without the use of tools, and results in lower electrical resistance and improved performance. Further, the connectors of the subject invention are capable of receiving and securely engaging a range of different wire sizes.

While there has been described what is considered to be preferred embodiments of the invention, variations and modifications thereof may occur to those skilled in the art once they become familiar with the basic concepts of the invention. Therefore, it is intended that the appended claims shall be construed to include all such variations and modifications as fall within the true spirit and scope of the invention.

What is claimed is:

1. An electrical assembly comprising in combination a printed circuit board having a contact aperture and a connector disposed within said contact aperture, said connector including a conductive, wire formed helix, said wire being resilient and having a substantially square cross section, one end of said helix being opened for receiving a wire lead, said helix tapering from said open end to the opposite end thereof, thus defining successive coils of progressively decreasing diameter, said helix being wound such that the edges of the square wire provide the helix with an external thread for engaging the contact aperture of said printed circuit board and retaining the connector therein, said edges further providing said connector with an internal thread for engaging said wire lead for retaining said wire lead in said connector.

2. An electrical assembly as recited in claim 1 in which the coils are spaced in a range of approximately 0.000 to 0.003 inches.

3. An electrical assembly as recited in claim 1 in which the wire has a maximum corner radius of 0.003 inches.

4. An electrical assembly as recited in claim 1 in which the helix has a taper of approximately ten degrees.

5. An electrical assembly as recited in claim 4 in which the coil forming the receiving end of the helix has a diameter of approximately 0.065 inches.

6. An electrical assembly comprising in combination first and second printed circuit boards disposed one above the other in substantially parallel spaced apart relationship each printed circuit board having a contact aperture; first spacer means disposed within the contact aperture of said first printed circuit board, said first spacer means including a conductive, wire formed helix, said wire being resilient and having a substantially square cross section, one end of said helix being open, said helix tapering from said open end to the opposite end thereof, thus defining successive coils of progressively decreasing diameter, the tapered portion of said helix being disposed within the contact aperture of said first printed circuit board, said helix being wound so that the edges of the square wire provide the helix with an internal thread and an external thread, said external thread engaging with and retaining said first spacer means within the contact aperture of said first printed circuit board; second spacer means disposed within the contact aperture of said second printed circuit board, said second spacer means including a conductive, wire formed helix, said wire being resilient and having a substantially suqare cross section, one end of said helix being open, said helix tapering from said open end to the opposite end thereof, thus defining successive coils of progressively decreasing diameter, said helix being wound so that the edges of the square wire provide said helix with an internal thread and an external thread, said external thread of said second spacer means engaging the contact aperture of said second printed circuit board for retaining the tapered portion of said second spacer means within said printed circuit board, the open end of said second spacer means being adjacent the open end of said first spacer means; and a spacer rod disposed within and threadably engaged by the respective internal threads of the first and second spacer means.

* * * * *